(12) United States Patent
Olsson et al.

(10) Patent No.: US 6,245,213 B1
(45) Date of Patent: Jun. 12, 2001

(54) METHOD FOR ANISOTROPIC ETCHING OF STRUCTURES IN CONDUCTING MATERIALS

(75) Inventors: Lennart Olsson, Malmö ; Babak Heidari, Lund, both of (SE)

(73) Assignee: Obducat AB, Malmo (SE)

( * ) Notice: Subject to any disclaimer, the term of this patent is extended or adjusted under 35 U.S.C. 154(b) by 0 days.

(21) Appl. No.: 09/262,740

(22) Filed: Mar. 5, 1999

Related U.S. Application Data

(63) Continuation of application No. PCT/SE97/01480, filed on Sep. 5, 1997.
(60) Provisional application No. 60/025,138, filed on Sep. 6, 1996.

(30) Foreign Application Priority Data

Sep. 6, 1996 (SE) .................................................. 9603260

(51) Int. Cl.⁷ ...................................................... C25F 3/00
(52) U.S. Cl. ............................ 205/646; 205/645; 216/13; 216/37; 216/84
(58) Field of Search ................................. 205/640, 645; 216/13, 37, 84

(56) References Cited

U.S. PATENT DOCUMENTS

| | | | |
|---|---|---|---|
| 4,279,707 | 7/1981 | Anderson et al. | 204/43 |
| 4,472,248 | 9/1984 | Koskenmaki | 204/43 |
| 4,642,168 | 2/1987 | Imai | 204/129.65 |
| 5,071,510 | 12/1991 | Findler et al. | 156/647 |
| 5,167,776 | 12/1992 | Bhaskar et al. | 205/75 |
| 5,262,021 | 11/1993 | Lehmann et al. | 204/129 |

FOREIGN PATENT DOCUMENTS

| | | |
|---|---|---|
| 0 392 738 A1 | 4/1990 | (EP) . |
| 0 553 465 A1 | 12/1992 | (EP) . |
| 0 563 616 A2 | 3/1993 | (EP) . |
| 0 563 744 A2 | 3/1993 | (EP) . |
| 0 595 053 A2 | 9/1993 | (EP) . |
| 344 082 | 3/1972 | (SE) . |
| WO 89/08323 | 9/1989 | (WO) . |

*Primary Examiner*—Randy Gulakowski
*Assistant Examiner*—Allen Olsen
(74) *Attorney, Agent, or Firm*—Finnegan, Henderson, Farabow, Garrett & Dunner, L.L.P.

(57) ABSTRACT

In a method for anisotropic etching of a structure in an electrically conductive substance to be etched, use is made of an etchant which in concentrated solution is usable for isotopic etching of structures in the substance to be etched. The substance to be etched is contacted with the etchant in a solution which is so diluted that the etchant is unusable for isotropic etching. The etchant is subjected, adjacent to the substance to be etched, to an electric field of such a strength that anisotropic etching of the substance to be etched is accomplished. Moreover, an etching fluid is described, comprising an etchant in dilute solution, in which the etchant is present in a concentration of 200 mM at most, and use of such an etching fluid for making structures which are 50 μm or less is also described.

23 Claims, 2 Drawing Sheets

METHOD FOR ANISOTROPIC ETCHING OF STRUCTURES IN CONDUCTING MATERIALS

This application is a a Continuing Application of PCT International Application No. PCT/SE97/01480, filed Sep. 5, 1997, the contents of which are incorporated herein by reference, and claims benefit of provisional application 60/025,138, filed Sep. 6, 1996.

FIELD OF THE INVENTION

The present invention relates to etching and concerns especially a method for etching which employs contacting a substance to be etched with a dilute etchant solution which is unusable for isotropic chemical etching of structures in the substance and subjecting the dilute etchant to an electric field that enables anisotropic etching of the substance to be accomplished.

The invention is especially applicable to the manufacture of matrices for optical storage media and in the electronics industry in the manufacture of printed boards and integrated circuits.

BACKGROUND ART

In many contexts it is desirable to provide small structures in the surface of a material. A known method for removing material in small dimensions is etching. A common field using etching is the production of electric conductors on printed circuits by removing portions of an electrically conductive layer.

In e.g. the electronics industry there is a need of producing smaller and smaller components, for instance by removing material in very small dimensions by etching. Today it is possible to produce etched structures having a width and depth below 1 $\mu$m.

For producing such small structures by etching, it is also desirable to remove material to varying degrees in different directions, i.e. to control the etching effect of an etchant in different directions. Etching with the same etching effect in all directions is generally called isotropic etching, whereas etching with a varying etching effect is called anisotropic etching.

When making small structures by etching, use is today made of different etching methods. These can be divided into dry methods and wet methods. Dry etching methods include, for instance, ion-beam etching which is a mechanically machining method, and plasma etching which is a chemically machining method. Wet etching methods include chemical etching and electrochemical etching.

In mechanical methods, such as ion-beam etching, a surface which is to be etched is bombarded with high-energy ions. The ions remove atoms from the surface mechanically. Such etching thus is anisotropic.

In chemically acting dry etching methods, such as plasma etching, the ions are guided to a surface of a substance to be etched by means of an electric field. Such etching is carried out mainly by chemical reactions and therefore is not as anisotropic as purely mechanical etching methods. Some degree of mechanical etching can also take place in chemically acting etching.

In plasma etching, an electric field is applied over a gas. The field is strong enough to make the gas be converted and ionised to form a reactive plasma. Reactive ions are passed by the electric field to a surface to be etched and react therewith in an etching manner.

Dry etching methods are today used in the electronics industry for production of electronic components. Anisotropic etching of structures in small dimensions, 1 $\mu$m and less, can be effected.

A serious drawback of the dry etching methods used today is that they are difficult to control since a large number of variables which affect the etching must be kept within strict tolerances. Thus, the technical equipment will be complicated and expensive. The cost of the equipment will also be affected by the size of the workpiece that is to be etched and increases significantly if the equipment is to be dimensioned for the handling of large workpieces.

When producing electronic components, such as integrated circuits and semiconductor components, great requirements are placed on the purity of the components. This requires in dry etching methods, especially in mechanically acting methods, careful cleaning of the etched material, since it has usually been contaminated by residual products. The cleaning operation itself involves an additional step, which besides being time-consuming also requires the use of cleaning agents which in turn have a negative influence on the environment.

To prevent the areas which are not be etched from being affected by the etching, it is common when etching very small structures and necessary in mechanically acting etching methods to mask these areas with a protective layer, called resist. When mechanically affected, for instance by ion bombardment, also the protective layer will be affected during etching. This results in two drawbacks, on the one hand that the protective layer must be very thick so as not to be removed completely in the course of etching and, on the other hand, that the contour of the protective layer towards the surface to be etched becomes uneven owing to the removing effect of the ions, which results in an uneven etched contour.

The substance to be etched is masked also in wet etching methods. Then the substance is immersed in an etching fluid containing an etchant, which, when contacting the substance, is capable of etching.

In chemical etching use is made of an etching fluid containing a solution of an etchant which is capable of etching, by spontaneous chemical reaction, a substance, i.e. the etchant will etch directly when contacting the substance to be etched. The etching occurs isotropically. The etching rate is affected by etching time, temperature and concentration of etchant. The etching fluid usually contains an oxidising agent, for instance $BR_2$, $H_2O_2$, $HNO_3$, a complexing agent, for instance $H_2SO_4$, HF, NaOH, and a solvent, for instance water or methanol. Examples of generally used and recommended compositions of etching solutions for different metals are disclosed in, for instance, "Handbok i metallmikroskopiering" (in English: "Handbook of Metallographic Microscopy"), Helfrid Modin and Sten Modin (1977, Meritförlaget, Johanneshov, Sweden). Typical concentrations of etchant for etching small structures, microstructures, are, for etching of e.g. chromium or copper, 0.8–1.2 M.

Some solvents dissolve a given crystal plane in a substance to be etched more rapidly than other planes, for instance in a semiconductor material, which results in a directionally dependent etching effect, i.e. anisotopic etching.

In electrochemical etching, the etching fluid contains an electrolyte, e.g. a salt solution, which in itself is not capable of etching the substance to be etched by spontaneous chemical reaction, i.e. the etchant does not etch merely by contacting the substance. By applying an electric voltage in the etching fluid between the substance to be etched and an electrode immersed in the etching fluid, an electrolytical process, however, will be begun, in which the substance to be etched is the one pole, usually the anode, and the electrode the other pole. In the electrolytic process, electric current flows in the etching fluid, and ions in the etching fluid react in an etching manner with the substance to be etched.

The etching rate is essentially proportional to the strength of current. The etching will be slightly anisotropic, although not to the same great extent as is possible in dry etching methods. For instance, it is possible to etch in an electrochemical manner structures having a depth-to-width ratio of 1:2.

Several techniques are known for applying voltage in pulses to obtain a good etching effect when using different electrolytes as etching fluid.

In wet etching methods, above all in chemical etching, so-called underetching occurs owing to the isotropic etching properties, i.e. etching off material under the surface that is coated with a protective layer. As a result, it is not possible in purely chemical etching to produce grooves or lines having a greater depth than width. Nor is it possible in electrochemical etching to etch, in case of small dimensions, grooves or lines whose depth exceeds the width. The possibilities of making narrow grooves, e.g. in order to arrange conductors closely together, are thus restricted when using wet etching methods. Furthermore, it is today not possible to produce by wet etching methods even structures, for instance grooves having straight walls, whose width or depth is less than 1 μm.

In wet etching, use is today generally made of fluids which are strongly toxic and harmful to the environment, which in itself is an environmental problem.

Purely chemical etching is also a process which is difficult to control since a plurality of parameters influence the speed of the process.

In electrochemical etching, all surfaces to be etched must be connected to an electric pole during the entire etching procedure. When making printed circuits, this is done by all conductors being interconnected at a connection point during the etching procedure. After completion of the etching, the connection point is removed mechanically in a special production step.

Many experiments have been made, however not quite successful so far, to provide a wet etching method that can be used in the production of small electronic circuits, such as integrated circuits.

OBJECTS OF THE INVENTION

One object of the present invention is to provide a new and enhanced method for etching by eliminating the above-mentioned drawbacks of the prior-art technique.

A special object is to provide an enhanced method for etching small structures, essentially structures which in one or more directions have a dimension less than 50 μm, and above all structures which in one or more directions have a dimension less than 10 μm.

A further object is to provide a method for wet etching, which permits etching of smaller structures than before, especially structures which in one or more directions have a dimension less than 1 μm.

A special object is to provide a method for wet etching, which permits anisotropic etching of small structures.

A particular object is to provide an easily controllable method for etching small structures.

A further object of the invention is to provide an enhanced method for plating.

SUMMARY OF THE INVENTION

According to the invention, these and other objects that will appear from the following description will be achieved by a method for anisotropic etching of a structure in an electrically conductive substance by means of an etchant which in a solution at a first concentration and in the absence of an electric field is capable of isotropically etching structures in the substance by spontaneous chemical reaction with the substance, the method comprising the steps of: contacting the substance with a solution of the etchant which is diluted to a second concentration lower than said first concentration and which is capable of isotropically etching structures in the substance by spontaneous chemical reaction with the substance in the absence of an electric field at a maximum etching rate of 5 nm/s, thereby making the solution of the etchant at the second concentration unusable for isotropic chemical etching of structures in the substance; and subjecting the solution of the etchant at the second concentration adjacent to the area of the substance to be etched to an electric field of such a strength that anisotropic etching of said structure in the substance is accomplished.

The invention is based on the surprising discovery that an etching fluid which has been diluted to have a negligible etching effect, can be used for anisotropic etching while subjected to an electric field.

In one aspect, the invention concerns etching of an electrically conductive substance by means of an etchant, which is present in a dilution which is diluted to such an extent that it is not practically usable for chemical etching. The concentration of the etchant is so low that such reactions between the etchant and the substance to be etched as result in the removal of atoms from the substance to be etched occur sporadically only. By producing an electric field in the etchant solution between an electrode and a surface portion of the substance to be etched, there is formed a local concentration of etchant on the surface portions of the substance to be etched. This results in a significant increase of the etching rate of the etchant, at the same time as the etching direction of the etchant is affected.

It is also possible to regard the invention as a method of transferring the conditions prevailing in dry etching methods to a wet environment in an etching fluid. In this manner, the advantages of dry and wet etching methods have been combined, while eliminating the drawbacks of the respective methods.

The invention relates to etching of an electrically conductive substance. Experiments have been made using various metals such as Cu, Ni, Ti, Al and Cr, but the inventive method is expected to work for other conductive materials, such as alloys, and for semiconductors. The electrical conductivity of the substance to be etched should be such as to allow an electric field to form in the dilute solution between the substance to be etched and an electrode.

The crystal structure of the substance to be etched is not critical, and the substance to be etched can thus be monocrystalline as well as polycrystalline.

The etchant should be capable of reacting, in solution, in an etching manner with a surface, intended to be etched, of the substance to be etched. Besides it is assumed that the etchant should be of such a nature as to be kinetically affected by an electric field, thereby permitting a local concentration of the etchant.

An important feature of the invention is that the etchant is present in solution of low concentration. On the basis of the experiments that have been carried out, it seems difficult to achieve an anisotropic etching effect in concentrations of the etchant above 200 mM. However, it has not been possible to determine a lower limit of concentration for a satisfactory function. It is also assumed that the etchant must have sufficient movability in the solution to permit a local concentration of the etchant.

It is assumed that the electric field has two functions, concentrating the etchant locally and accelerating the etching, of which the first-mentioned function is presently assumed to be the most important.

It is supposed that the electric field should be directed to the surface of the substance that is to be etched. To make it possible to locally increase the concentration of the etchant, the extent of the electric field adjacent to the surface that is to be etched should be relatively restricted.

It is preferred that the etchant, at least in concentrated solution, is capable of etching the substance to be etched in the absence of an electric field, i.e. that the etchant is capable of spontaneous chemical etching of the substance to be etched. Even if the new, low concentration of the etchant according to the invention in certain applications can be expected to confer advantages also in connection with electrochemically etching etchants, the results which have been best so far have been obtained in experiments with chemically etching etchants.

In view of what has been said above, the invention may also be regarded as a method for anisotropic etching of a structure in an electrically conductive substance to be etched by means of an etchant which in concentrated solution is usable for isotropic etching of structures in the substance to be etched, said method being characterised by the steps of contacting the substance to be etched with the etchant in a solution which is so diluted that the resulting etching rate implies that the etchant is unusable for said isotropic etching of structures; and subjecting the etchant adjacent to the substance to be etched to an electric field of such a strength that anisotropic etching of the substance to be etched is accomplished at an etching rate which is relevant for producing said structure in the substance to be etched.

The invention is especially directed to the production of small structures in the order of 50 μm and less in respect of etching width as well as etching depth. The invention has been found especially advantageous when producing structures whose width or height is less than 10 μm.

By the solution having an extremely low concentration of etchant and the relevant etching process occurring under the action of an electric field, the etching process obtains an essentially improved controllability and anisotropy compared with prior-art wet methods. This makes it possible to produce and use small etched structures, on the one hand for known constructions and, on the other hand, in new technical fields.

An important property of the invention is that it is possible to etch lines and grooves having a greater depth than width. In experiments, the depth-to-width ratio of an etched groove has been measured to be 3.5:1 when etching a thin copper foil.

The method is inexpensive and requires but relatively simple equipment. Since the etching fluids used have a low concentration of etchant in solution, the etching fluids can be made practically non-poisonous, which results in benefits in the working environment as well as in the exterior environment.

Moreover, the inventive method exhibits low sensitivity to variations in temperature. For example, excellent results have been obtained when etching in the temperature range of 15° C.–30° C. In this range, no considerable temperature influence could be demonstrated, and it is therefore assumed that the desired result can be achieved within a considerably wider range of temperature.

The method does not also exhibit any critical sensitivity to variations in concentration within an effective range of concentration. Experiments have shown that about a concentration value giving good etching results for a certain combination of etchant/etching fluid, it is possible to change the concentration value by a factor two without the etching result being significantly deteriorated.

The inventive method also permits anisotropic etching of small structures without using a protective layer, resist, on surrounding areas of the substance to be etched, since practically no etching occurs in areas that are not subjected to an electric field.

Preferably, the etching fluid in dilute solution is present during etching in such a state that its capability of etching spontaneously, i.e. in the absence of an electric field, is limited to an etching rate of 5 nm/s. If the etchant etches spontaneously at a higher rate, the process will be difficult to control and relatively isotropic, which when using a protective layer results in underetching.

To provide anisotropic etching, the spontaneous etching capability of the etchant is more preferably limited to 4 nm/s at most. In experiments, it has been found that further restrictions of the spontaneous etching rate to 3 nm/s and less given still better results, above all a higher degree of anisotropy and the possibility of etching smaller structures. The maximum spontaneous etching rate that can be permitted with maintained controllability of the etching process depends on the composition of the substance to be etched and the size of the structure to be etched.

For instance, experiments have been made with copper as substance to be etched and an ammonium persulphate solution as etching fluid, which has a spontaneous etching rate of about 3 nm/s. It has been possible to measure a depth-to-width ratio of 3:1 in the groove. In experiments at sill lower etching rates, the etching process has become still more controllable, and a width-to-depth ratio of 3.5:1 has been measured.

In other experiments in etching chromium, extremely good results have been obtained with etching solutions having a spontaneous etching rate below 0.3 nm/s.

In a preferred embodiment of the etching method, the etchant, which preferably etches isotropically in the absence of an electric field, is caused to etch, by means of the electric field, anisotropically at a higher rate, preferably at at least the double rate, and more preferred at a rate which is ten times higher. Still better results can be expected when increasing the etching rate further, such as 50 times or 100 times. When etching chromium, the etching rate in the desired direction has been increased from below 0.3 nm/s to above 55 nm/s, thus in the order of 200 times, under the action of an electric field.

The preferred concentration of the etchant is 100 mM at most, preferably 20 mM at most, and more preferred 10 mM at most. It may be generally said that the controllability of the etching process, especially when etching small structures, increases with a reduced concentration of the etchant. In some contexts, it has been found advantageous to have concentrations of the etchant below 2 mM, and especially advantageous to have etchant concentrations of 1 mM and less.

The etchant according to the present invention can preferably be defined as an ionic substance capable of reacting in an etching manner with the substances to be etched. The concentrations that are stated in connection with the invention concern the concentration of the etchant which is active according to the invention.

The step of subjecting the etchant to an electric field preferably comprises contacting an electrode with the etchant and applying a voltage between the electrode and the substance to be etched. The distance between the electrode and the etchant is 3 cm at most and preferably 1 cm at most, and more preferred 1 mm at most. The closer to the surface of the substance that is to be etched the electrode is arranged, the higher the etching rate and the better the controllability in the etching process. Various, still shorter distances down to 4 nm have been tested successfully. It may be generally said that when the area round a surface which is to be etched is covered by a protective layer, the demands placed on the design of the electrode and the distance therefrom are not as high as in the case when no protective layer is arranged. For carrying out anisotropic etching of small structures below 50 µm, it is assumed in the latter case that the electrode should be arranged closer than 50 µm to the surface that is to be etched. It is also assumed that the surface area and surface shape of the electrode are important for controlling the extent of the electric field. It is above all important to concentrate the electric field in the area that is to be etched.

Since the inventive method is a wet etching method, the substance to be etched is not contaminated with material that has been removed by etching, like in dry etching methods, but instead the removed material will be collected adjacent to the electrode.

It is preferred that the voltage between the electrode and the substance to be etched is at least 0.5 V, preferably at least 1 V and more preferred at least 1.5 V, and 10 V at most, preferably 5 V at most and more preferred 3 V at most. Good results have been achieved in the range 2 V–2.8 V and particularly good results have been achieved in the range 2.4V–2.6 V. It is difficult to determine a lower limit for the voltage required for etching, and the above-mentioned values are values where a practically usable etching rate is reached. However, it is important that the voltage is not as great as and reversed to the electrochemical potential between the substance to be etched and the electrode, which implies that all etching effect ceases. It may be generally said that the higher voltage applied, the more rapid the etching. At higher voltage levels, the etching is transformed into polishing, in which case no effective etching can be accomplished. A further increase of the voltage results in uncontrolled discharges in the border line between etching solution and substance to be etched, so-called pitting.

It may be concluded from the experiments carried out that the strength of the electric field is important to the process, but that it is difficult to derive an unambiguous connection for this. Experiments rather demonstrate that the voltage level is more critical for producing a good result.

In a preferred embodiment, the electric field is pulsed such that etching occurs during a plurality of first periods. Between the first periods the field is given a reversed direction during a plurality of second periods.

In a special embodiment, there is preferably applied during these second periods, between the electrode and the substance to be etched, a voltage, the size of which corresponds to and the direction of which is reversed to the electrochemical potential between the electrode and the substance to be etched, in the etchant. A reverse voltage thus arises and stops all chemical etching.

In a further special embodiment, there is applied between said first periods a reverse voltage, the size of which is greater than that of the electrochemical potential. In this context, the etching process is reversed and a plating operation is carried out during the second intermediate periods by a certain amount of previously etched-away substance being returned. As a result, the design of the surface structure can be further controlled.

It is assumed that rapidly passing from a first period to a subsequent second period of one of the types described above ensures that residuals from the etching are released from the surface that is to be etched. If these residuals are allowed to cover the surface of the substance that is to be etched, further etching of this surface is prevented, and therefore the etching will be more isotropic.

Preferably, said first periods are as great as the time interval therebetween and amount to 200 ms at most, preferably 100 ms at most, and at least 10 ms, preferably at least 50 ms. It may be generally said that the pulsing, which serves to release residual products, is most important when etching structures having a greater etching depth than etching width, since it is on these occasions that the anisotropic etching effect is most important. The greater the ratio between etching depth and etching width, the shorter should be the periods.

In a special aspect of the invention, it is also possible to coat, by means of a concentrated electric field and a small electrode arranged adjacent to a material to be plated in a strongly diluted plating solution a surface having small structures in a manner corresponding to that in etching according to the invention. It is thus possible on the one hand to carry out plating as a partial step during etching and, on the other hand, to carry out plating of small structures under purely plating-chemical conditions.

BRIEF DESCRIPTION OF THE DRAWINGS

The invention will now be described in more detail with reference to the drawings, which for the purpose of exemplification illustrates embodiments of the invention and in which.

DESCRIPTION OF THE PREFERRED EMBODIMENTS OF THE INVENTION

Figure 1:
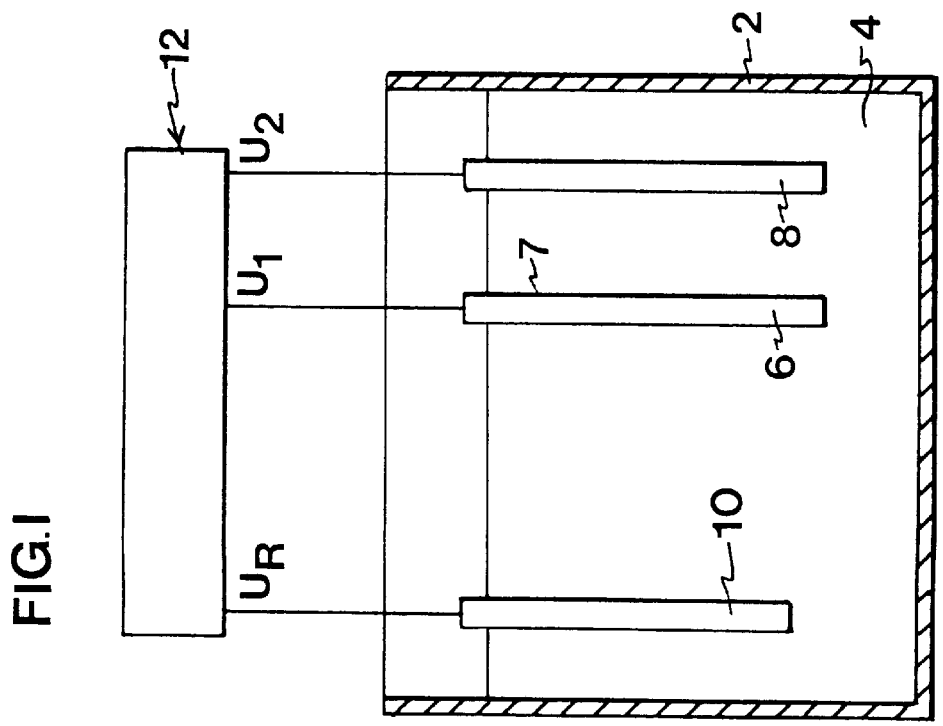
FIG. 1 is a schematic view of an arrangement of an apparatus for carrying out the inventive method.

An embodiment of the invention will now be described in more detail with reference to FIG. 1. A substance 6 to be etched of an electrically conductive material is immersed in a vessel 2 containing an etching fluid 4. The etching fluid 4 contains an etchant in dilute solution. Moreover, an electrode 8 is immersed in the etching fluid 4. The electrode 8 is arranged at a distance from a surface 7 to be etched of the substance 6 to be etched. A control unit 12, which comprises a voltage source, is connected between the electrode 8 and the substance 6 to be etched.

The control unit 12 preferably is a device which is capable of controlling current between and voltage across the substance 6 to be etched and the electrode 8.

Such controlling can be carried out by, for instance, a computer program. The control unit 12 should be capable of letting current flow in both directions. Besides, it should be possible, when there is not current flow between the electrode and the substance to be etched, to read the voltage that arises through the electrochemical potential difference between the substance 6 to be etched and the electrode 8. The latter is intended for reading the etching depth/topography of the substance to be etched through said potential difference.

The etching fluid 4 is chemically etching and the etchant is capable of etching the substance 6. The etchant is present in the etching fluid 4 in such a dilute solution that the etching fluid is not usable for spontaneous chemical etching. The etching fluid can be prepared, for instance, by diluting 20 times, 100 times or more a commercially used etching fluid, which in normal use, i.e. in concentrated form, is usable for chemical etching of the substance to be etched. The etchant thus reacts in a chemically etching manner with the substance to be etched.

The etchant concentration in the dilute solution allows merely sporadic etching activities which result in the removal of atoms from the substance to be etched.

A voltage, typically in the order of 1 V–4 V, is applied between the electrode and the substance to be etched. Thus, an electric field forms in the etching fluid 4 between the electrode 8 and the surface 7 to be etched of the substance 6.

The electric field produces a local etchant concentration on the surface 7 to be etched and increases the tendency of the etchant to react with the substance to be etched, and therefore the etchant will, under the action of the electric field, etch the surface 7 to be etched at a considerably increased etching rate.

The substance 6 to be etched is masked adjacent to the surface 7 to be etched with a protective layer, a so-called resist layer, with which the etchant does not react. It is common to use a photoresist layer, which is formed by a per se known, photographic exposing and developing procedure.

Two different embodiments will be described below with reference to an arrangement of the type described above.

EXAMPLE 1

In this experiment, chromium was etched with an etchant in 9.11 mM solution, and the experiment comprised the following steps:

A board of nickel was coated with a 100 nm-thick layer of chromium by electrochemical plating. The chromium surface was coated with a protective layer in the form of a photoresist layer, whereupon a pattern (lines and points having a width of 0.5 $\mu$m) was exposed and developed for etching of uncovered surfaces of the substance to be etched.

The etching fluid was prepared by mixing the etchant $Ce(NH_4)_2(NO_3)_6$ in a quantity of 2 g in 1 ml $CH_3COOH$ and 500 ml deionised water (18 M$\Omega$ water) and was filtered in a 0.2 $\mu$m filter. The chemical etching rate of the solution was then <0.3 nm/s.

A flat electrode of TiN used as cathode and the Ni—Cr-board used as anode were immersed in the etching fluid together with a third electrode (chemically stable) which was used as reference electrode for voltage measurement. The cathode and the anode were applied in plane-parallel configuration and at a distance of 1 mm from each other.

A device for generating current in the fluid between cathode and anode was connected.

The potential of the anode was set at +0.7 V and the potential of the cathode was set at 0 V, which resulted in a total etching stop, whereupon a pulse having the length 100 ms and the amplitude +2.5 V was applied to the cathode. The temperature was constantly kept at 25° C.

When carrying out the experiment, the chromium layer was completely etched through after two pulses (thus, after less than 200 ms effective etching time). Then the cathode voltage was again set at 0 V in order to avoid underetching. No underetching could be measured.

This experiment is one in a series of etching experiments in etching chromium. In the accompanying Table I, some test parameters are stated. Etching fluids having an etchant concentration of up to 45 mM have been tested with excellent results. The best results, i.e. perpendicular and even edges with no noticeable underetching, were obtained with concentrations below 25 mM. Etching while using constant direct current, 50 ms pulse and 100 ms pulse, gave similar results. The experiment described above resulted in the lowest etchant concentration and the best etching result.

EXAMPLE 2

In this experiment, a 5 $\mu$m-thick copper layer on a commercial laminate was etched with an 87.72 mM etching fluid. The experiment comprised the following steps:

A pattern (5 $\mu$m to 25 $\mu$m thick lines) for etching of uncovered surfaces of the substance to be etched was produced in a manner corresponding to the above described experiment by means of a photoresist layer on the laminate.

The etching fluid was prepared by mixing 2 g ammonium persulphate with 100 ml deionised water. The chemical etching rate of the solution then was <2 nm/s.

A flat electrode of TiN, which was used as cathode, and the copper laminate, which was used as anode, were immersed in the etching fluid together with a third electrode (chemically stable), which was used reference electrode for voltage measurement. The cathode and the anode were applied in plane-parallel configuration and at a distance of 2 mm from each other.

A device for generating current in the fluid between cathode and anode was connected.

The potential of the anode was set at –0.3 V and the potential of the cathode was set at 0 V, which resulted in a total etching stop, whereupon a pulse having the length 50 ms and the amplitude +3.5 V was applied to the cathode.

A slight flow of etching fluid was pulsed across the copper surface in a manner synchronised with the lower value of the cathode pulse.

The copper layer was completely etched through after 180 pulses (thus, after less than 9 s effective etching time). Then the cathode voltage was again set at 0 V in order to avoid underetching. The total underetching was measured to be 1 $\mu$m maximum.

A corresponding experiment in etching of copper has also been carried out with a corresponding etching fluid at 22 mM concentration of etchant. This resulted in no appearance of underetching. The test parameters are stated in the enclosed Table II.

In the experiment according to Example 2, the potential of the anode and cathode has been varied such that the potential of the anode, after carrying out some etching, was set at a lower value than –0.3 V during periods when the potential of the cathode was 0. In this context, plating-chemical conditions will form, in which the liquid with etched-away substance acts as a plating agent and etched-away substance is returned to the open copper surfaces. By the thus-achieved plating during periods between periods when etching is carried out, the surface structure of the etched surfaces is changed.

The following conclusions have been drawn from the experiments described above:

a) Etching fluids etching chemically at a rate of up to 3 nm/s and probably also higher and/or having a concentration of etchant of up to 90 mM and probably also higher are extremely usable for accomplishing anisotropic etching of structures in the order of 5 $\mu$m.

b) The smaller structures to be etched, the lower chemical etching rate of the etching fluid and the lower concentration of the etchant are required for anisotropic etching.

It has not yet been possible to unambiguously determine what laws determine the etching according to the inventive method. Without binding the invention to a specific theory, it is assumed that the invention functions as follows.

The etching fluid has such a low concentration of the etchant that the reactive ions get in contact with the substance to be etched sporadically only and cause isotropic etching reactions on the surface of the substance to be etched. By applying a voltage in the etching fluid between an electrode and a limited surface of the substance to be etched, an electric field and a local concentration of active ions are produced. The electric field also accelerates active ions so as to give them a speed towards the substance to be etched.

The etching fluid has, in its capacity as ion solution, electrical conductivity, and therefore a current flows between the electrode and the substance to be etched when voltage is applied therebetween. Under the action of the current, the capacity of the active ions of reacting in an etching manner with the substance to be etched increases by the current accelerating the etching reactions between the active ions and the substance to be etched.

The anisotropic properties of the etching method are assumed to be caused mainly by the electric field initially giving the active ions a speed in the direction of the field. When etching, for instance, a groove which has already been etched to a certain depth, i.e. such that the groove already has a bottom and two walls, anisotropic etching requires that the active ions which are passed into the groove be mainly caused to etch the bottom of the groove. If the active ions should follow the field lines of the electric field, a great part of the ions would be caused to etch the walls of the groove. Since this is not the case in the inventive method, it is assumed that the inertia of masses of the active ions in the groove prevails over the effect of the electric field.

By using very low concentrations the process will be controllable. Too high concentrations result in relevant etching taking place also in the absence of an electric field. Besides, it is not possible with initially high concentrations to achieve satisfactory anisotropy during etching, since the electric field produces an uncontrollable concentration of active ions.

Figure 2A:
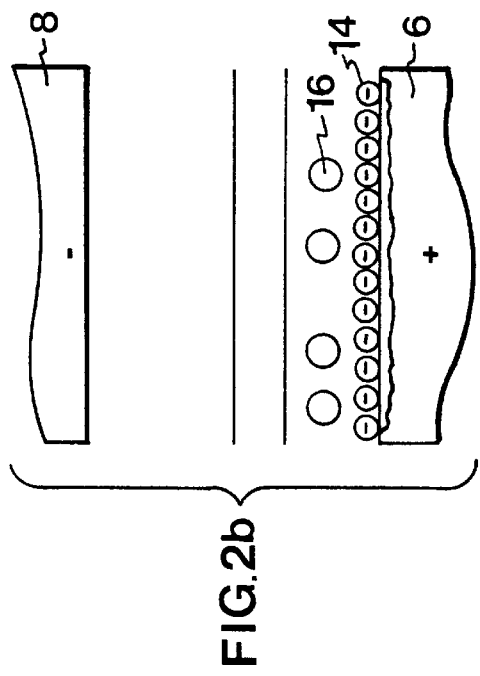
FIG. 2 is a schematic cross-sectional view of an etched groove.
Figure 2B:
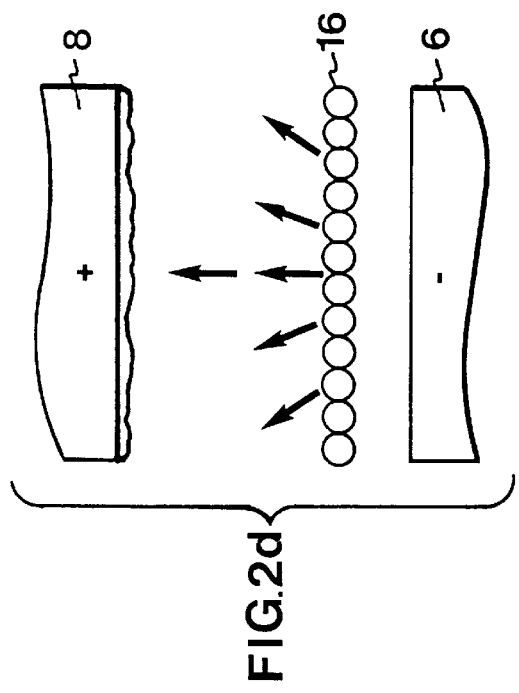
Figure 2C:
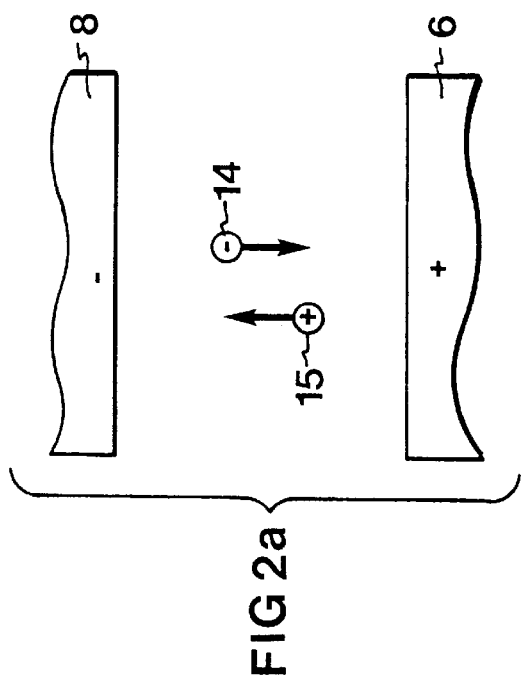
Figure 2D:
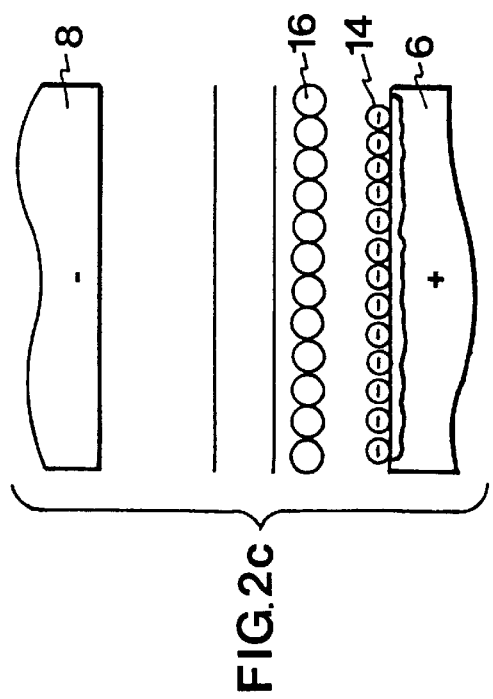

Reference is now made to FIGS. 2a–d. An inconvenience when etching is that residual products, which form as the active ions react in an etching manner with the substance to be etched, form a blocking layer after some time, thereby preventing further active ions from contacting the substance to be etched. FIG. 2a illustrates how ions in the etching fluid are pulled in different directions under the action of the electric field. In FIG. 2b, active ions 14 have reached the substance 6 to be etched and have begun the etching and the forming of residual products 16. FIG. 2c illustrates how a blocking layer of residual products 15 has been formed. The forming of such a blocking layer also prevents anisotropic etching. The inconvenience is particularly pronounced in anisotropic etching of a bottom surface in a groove. This inconvenience is obviated by changing the direction of the electric field, such that the active ions 14 are pulled away from the substance 6 to be etched in the direction of the electrode 8. This is illustrated in FIG. 2d. As a result, the blocking layer is broken and the residual products 16 can be spread in the etching fluid. Even if the blocking layer is broken at regular intervals by changing the direction of the electric field, the removal of residual products 16 is assumed to be the limiting factor for anisotropy when etching small grooves having a greater depth than width. For maintaining anisotropy as far as possible when etching deep structures, it is preferred to let the electric field change direction by pulsating the voltage. The deeper the structure, the shorter etching pulse time is required.

By changing the voltage in pulses of different wave shape, different etching geometries will form. In the special embodiment of the invention when plating is carried out between periods of etching, particular possibilities of additional process control are achieved.

Only small currents are required to obtain a good etching result with an electrically conductive etching fluid. Thanks to this, all surfaces that are to be etched need not be connected to a common electric pole during the entire etching procedure. In the presence of a surface, which is to be etched and is connected to the electric pole, of the substance to be etched, the etching fluid has in fact the capacity of conducting small currents to another surface to be etched of the substance and thus connecting this other surface to be etched to the electric pole.

This property is usable, for instance, when producing narrow grooves in an electrically conductive substance to be etched, which is present in a thin layer on an insulating material. The entire layer to be etched is, in the initial etching phase, electrically connected to the same electric pole. When the groove has been etched throughout along a line between the edges of the groove, the electric connection between the edges of the groove is interrupted. In the etching method according to the invention, small currents will continue to be conducted between the surfaces of the substance to be etched, for instance between the two sides of the groove and possibly also a remaining intermediate portion of the substance to be etched, and therefore the etching procedure continues until one chooses to stop it, when the etching is completed. Therefore no interconnection of a plurality of separate remaining portions is necessary.

Special embodiments of the inventive method will now be described.

When etching a substance consisting of two or more superimposed layers of conductive materials having different electrochemical potentials, it is possible to easily determine the etched depth. This is accomplished by determining, in the absence of an applied voltage, the galvanic voltage between the substance to be etched and a reference electrode. When the substance to be etched comprises two different materials which are, to a different extent, in electrically conductive contact with the etching fluid, different galvanic voltages will form in the fluid.

Figure 3:
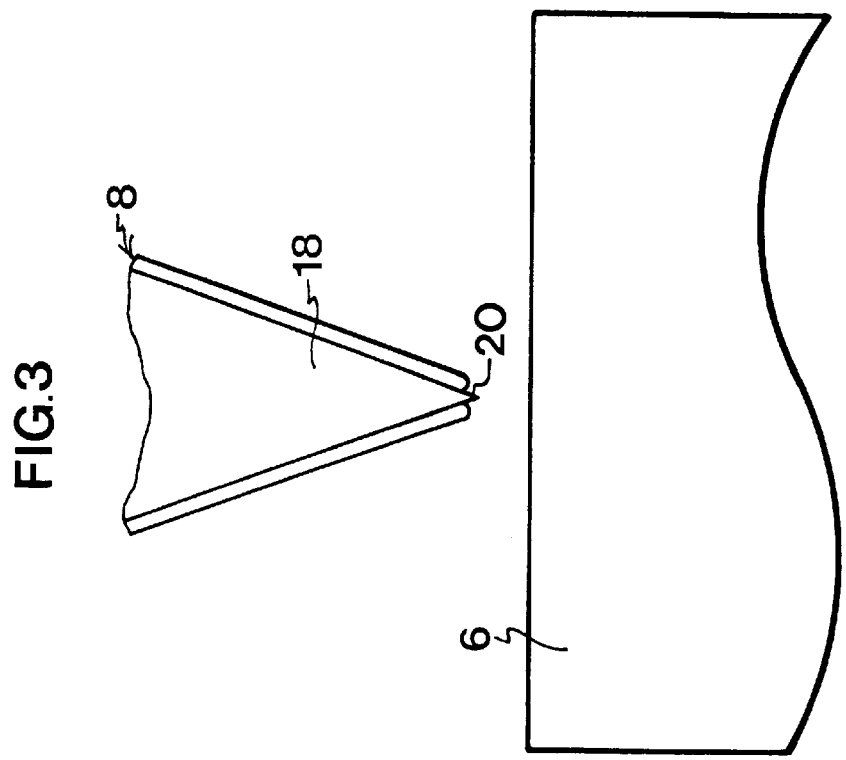
FIG. 3 is a schematic cross-sectional view of an embodiment of the invention having a pointed electrode.

In a special embodiment of the invention, shown in FIG. 3, the electrode 8 is formed with a tapering portion 18 directed to the electrically conductive substance 6. The electrode has a tip which is insulated with an electrically insulating layer except at its outer end 20. By using such a pointed electrode 6, it is possible to etch very small structures anisotropically without the presence of a layer protecting against etching. In experiments with such a point electrode at a distance of 4 nm from the substance to be etched, it has been possible to etch grooves having a width of 35 nm without using a layer protecting against etching.

By means of the invention and various embodiments thereof, a great number advantages are achieved. For instance, it may be mentioned that the method is extremely gentle, on the one hand since the etching solution is strongly diluted and, on the other hand, since only low voltages are used. This results in the layer protecting against etching not being subjected to any considerable action during etching. It is therefore possible to use a very thin layer protecting against etching, down to molecular thickness, of an insulating substance. Moreover, it is possible to maintain even edges of the protective layer adjacent to a surface to be etched during etching, and thus to etch even contours, also in very small structures, down to nanometer level. Up to now, this has not been possible to achieve by using a prior-art etching method.

The inventive method is also more rapid than plasma etching, and etching equipment for high-accuracy etching of large workpieces conforms to etching equipment for etching of small workpieces, and therefore high-accuracy etching of large workpieces has been rendered possible at a reasonable cost.

TABLE I

| No. | Ce(NH$_4$)$_2$(NO$_3$)$_6$ [g] | CH$_3$COOH [ml] | H$_2$O [ml] | | Voltage [v] | Temp. [°C.] | Total time [110 nm] | Conc. [mMLAR] active |
|---|---|---|---|---|---|---|---|---|
| 16– | 20 | 3.5 | 1000 | | 2 V | 25 | | 36.21 |
| 17 | 25 | 5 | 1000 | DC/(50 ms pulse) | 2 V | 25 | | 45.39 |
| 18* | 5 | 5 | 500 | DC | ≦2 V | 25 | ≦2 s | 18.07 |
| 19* | 5 | 1 | 400 | DC/(50 ms pulse) | 2 V | 25 | ≦2 s | 22.75 |
| 20* | 5 | 1 | 1000 | DC/(100 ms pulse) | 2 V | 25 | ≦2 s | 9.11 |

\* = For optimum results. Easy to control the edge shape (chemical etching <3 Å/s)
– = Some underetching

TABLE II

| No. | Ammonium persulphate [g] | H$_2$O [ml] | Note | Conc. [mMLAR] |
|---|---|---|---|---|
| 3 | 2 | 100 | (2 v, 60 ms pulse), (10–15 s), 5–10 μm Cu | 87.72 |
| 4 | 0.5 | 100 | (2 v, 150 ms pulse), (10 s), 5 μm Cu | 21.93 |

What is claimed is:

1. A method for anisotropic etching of a structure in an electrically conductive substance by means of an etchant which in a first solution at a first concentration and in the absence of an electric field will isotropically etch structures in the substance by spontaneous chemical reaction with the substance, said method comprising the steps of:

contacting the substance with a second solution of the etchant which is diluted to a second concentration lower than said first concentration and which will isotropically etch structures in the substance by spontaneous chemical reaction with the substance in the absence of an electric field at a maximum etching rate of 5 nm/s; and subjecting the second solution adjacent to the area of the substance to be etched to an electric field of such a strength that anisotropic etching of said structure in the substance is accomplished.

2. The method as claimed in claim 1, wherein the concentration of the etchant in the second solution is 200 mM at most.

3. The method as claimed in claim 1, wherein the maximum isotropic etching rate of the second solution in the absence of an electric field is 3 nm/s.

4. The method as claimed in claim 1, wherein the strength of the electric field is such that the rate of the anisotropic etching is at least two times greater than the isotropic etching rate in the absence of the electric field.

5. The method as claimed in claim 4, wherein the anisotropic etching rate is at least ten times greater than the isotropic etching rate in the absence of an electric field.

6. The method as claimed in claim 2, wherein the concentration of the etchant in the second solution is 100 mM at most.

7. The method as claimed in claim 6, wherein the concentration of the etchant in the second solution is 50 mM at most.

8. The method as claimed in claim 7, wherein the concentration of the etchant in the second solution is below 10 mM.

9. The method as claimed in claim 1, wherein the etchant is an ionic substance that chemically reacts in an etching manner with the substance to be etched.

10. The method as claimed in claim 1, wherein the step of subjecting the second solution to an electric field comprises contacting an electrode with the second solution and applying a voltage between the electrode and the area of the substance to be etched.

11. The method as claimed in claim 10, wherein the electrode is arranged at a distance from a surface of the substance to be etched, the distance being 3 cm at most.

12. The method as claimed in claim 11, wherein the distance is 1 cm at most.

13. The method as claimed in claim 12, wherein the distance is 1 mm at most.

14. The method as claimed in claim 10, wherein the applied voltage between the electrode and the area of the substance to be etched is at least 0.5 V and 10 V at most.

15. The method as claimed in claim 14, wherein the applied voltage is at least 1 V and 5 V at most.

16. The method as claimed in claim 15, wherein the applied voltage is at least 1.5 V and 3 V at most.

17. The method as claimed in claim 10, wherein the electrode has a tapering portion directed toward the electrically conductive substance and arranged at a distance of 10 nm at most from the substance to be etched.

18. The method as claimed in claim 1, wherein the anisotropic etching is carried out during a plurality of first periods, between which the electric field is changed.

19. The method as claimed in claim 18, wherein the direction of the electric field, between said first periods, is reversed during second periods.

20. The method as claimed in claim 19, wherein plating is accomplished during said second periods, and a portion of previously etched-away substance is returned to the substance to be etched.

21. The method as claimed in claim 19, wherein, between said first periods, measurement of the etched depth is carried out during periods in which no electric field affects the circuit.

22. The method as claimed in claim 19, wherein the duration of said first periods is as great as the time interval therebetween and is 200 ms at most and at least 10 ms.

23. The method as claimed in claim 22, wherein the duration of said first periods is 100 ms at most and at least 50 ms.

* * * * *

UNITED STATES PATENT AND TRADEMARK OFFICE
CERTIFICATE OF CORRECTION

PATENT NO. : 6,245,213 B1
DATED : June 12, 2001
INVENTOR(S) : Lennart Olsson et al.

It is certified that error appears in the above-identified patent and that said Letters Patent is hereby corrected as shown below:

Column 14,
Line 59, "circuit" should read -- etchant --.

Signed and Sealed this

Twenty-eighth Day of May, 2002

Attest:

Attesting Officer

JAMES E. ROGAN
Director of the United States Patent and Trademark Office